United States Patent [19]
Lee et al.

[11] Patent Number: 6,150,240
[45] Date of Patent: Nov. 21, 2000

[54] METHOD AND APPARATUS FOR SINGULATING SEMICONDUCTOR DEVICES

[75] Inventors: Minju Lee, Kyunggi-do; Kilho Cho, Seoul, both of Rep. of Korea

[73] Assignee: Motorola, Inc., Schaumburg, Ill.

[21] Appl. No.: 09/122,921

[22] Filed: Jul. 27, 1998

[51] Int. Cl.⁷ .................................................. H01L 21/301
[52] U.S. Cl. .................................. 438/460; 83/25; 83/35; 83/452
[58] Field of Search .................................... 438/460, 462, 438/464, FOR 385, FOR 386, 110, 115; 83/23, 25, 27, 34, 35, 39, 167, 452, 648, 906; 269/37, 53, 54.3; 206/710, 711, 713; 414/935, 936

[56] References Cited

U.S. PATENT DOCUMENTS

| | | | |
|---|---|---|---|
| 3,851,758 | 12/1974 | Makhijani et al. | 206/328 |
| 3,899,379 | 8/1975 | Wanesky | 269/21 |
| 3,976,288 | 8/1976 | Cuomo et al. | 269/21 |
| 4,037,830 | 7/1977 | Poluzzi et al. | 269/21 |
| 4,410,168 | 10/1983 | Gotman | 269/21 |
| 4,451,972 | 6/1984 | Batinovich | 438/460 |
| 4,652,135 | 3/1987 | Ono | 356/401 |
| 5,516,728 | 5/1996 | Degani et al. | 438/465 |
| 5,827,394 | 10/1998 | Lu | 156/344 |
| 5,934,566 | 8/1999 | Kanno et al. | 239/398 |
| 5,953,590 | 9/1999 | Piper et al. | 438/113 |

*Primary Examiner*—John F. Niebling
*Assistant Examiner*—Christopher Lattin
*Attorney, Agent, or Firm*—Robert F. Hightower

[57] ABSTRACT

Method and apparatus for singulating semiconductor devices (21) is provided. This approach eliminates the need for an adhesive tape. A fixture (10) is provided to hold the joined semiconductor devices. The fixture has grooves (14 and 18) to accommodate a saw blade (35). The saw makes a cut in two directions thereby separating or singulating the semiconductor devices. Bars (24) are placed across the semiconductor devices when sawing in the second direction to hold the semiconductor devices in the holding fixture. A pick and place machine can then be used to remove the singulated semiconductor devices from the holding fixture.

4 Claims, 2 Drawing Sheets

METHOD AND APPARATUS FOR SINGULATING SEMICONDUCTOR DEVICES

BACKGROUND

This invention relates, in general, to singulating a plurality of integrally joined devices, and more particularly, to a method and apparatus for singulating a plurality of integrally joined semiconductor devices.

Semiconductor integrated circuits are typically made on a silicon wafer. In order to singulate or separate the individual integrated circuits the wafer is placed on the sticky side of a tape. Then a saw or laser is used to cut through the silicon wafer thus singulating the individual integrated circuits.

More recently it has become common practice to take the singulated integrated circuits and mount a plurality of them on a printed circuit board (PCB). The top side of the PCB having the integrated circuits is then encapsulated with an epoxy material. Electrical contact to each of the integrated circuits can then be made from the bottom of the PCB. However, before the integrated circuit can be used it must be singulated. That is, it must be separated from the other encapsulated integrated circuits that are mounted on the PCB. Typically the PCB is square or rectangular and the bottom side of the PCB is placed on the sticky side of a tape as was the wafer. Then the encapsulating material and PCB is sawed through in order to separate the individual integrated circuits. However this procedure has several disadvantages, such as, the cost of the sticky tape, the task of removing the tape from the back of the piece of PCB having the integrated circuit, and cleaning the sticky adhesive from the back of the PCB so that electrical contact can be made to the integrated circuit through the back of the PCB.

Accordingly, the present invention overcomes the above and other disadvantages of the prior approach to singulating the plurality of semiconductor devices that are joined by the encapsulating material and the PCB.

DETAILED DESCRIPTION OF THE DRAWINGS

Figure 1:
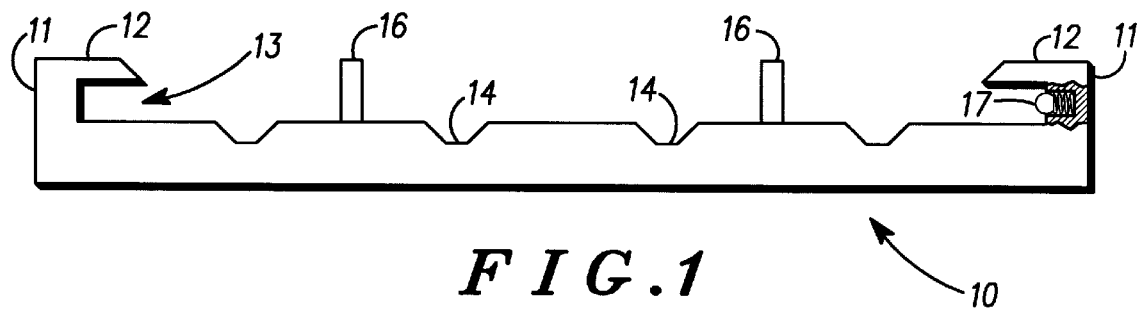
FIG. 1 is an end view of a holding fixture used in the present invention.

FIG. 1 illustrates an end view of a holding fixture 10 used in the present invention. Holding fixture 10 has extensions 11 extending upwards along two sides. Extensions 11 have a portion 12 bent over towards a central region of holding fixture 10 to form slots 13. Slots 13 are thus formed by the inside base of holding fixture 10 and bent over portions 12. The inside base of holding fixture 10 has a plurality of grooves 14. At the far end, two pins 16 protrude upward from the inside base. Along at least one slot 13 is a pair of spring loaded spherical bearings 17 shown through a portion of extension 11 which is cutaway for better viewing.

Thus a PCB containing a plurality of integrally joined semiconductor devices can be inserted into slots 13 and slid back until stopped by stop pins 16. Spring loaded bearings 17 serve to compensate for tolerance variations of the inserted PCB. Any suitable spring mechanism that allows the PCB to slide could be used in place of bearings 17. Grooves 14 must be deep enough to accommodate the protrusion of the saw blade through the PCB during the sawing process. Stop pins 16 serve to align the semiconductor devices on the PCB with grooves 18 (shown in FIG. 2) and prevents the PCB from sliding out of slots 13 due to force from the saw blade during the sawing process.

Figure 2:
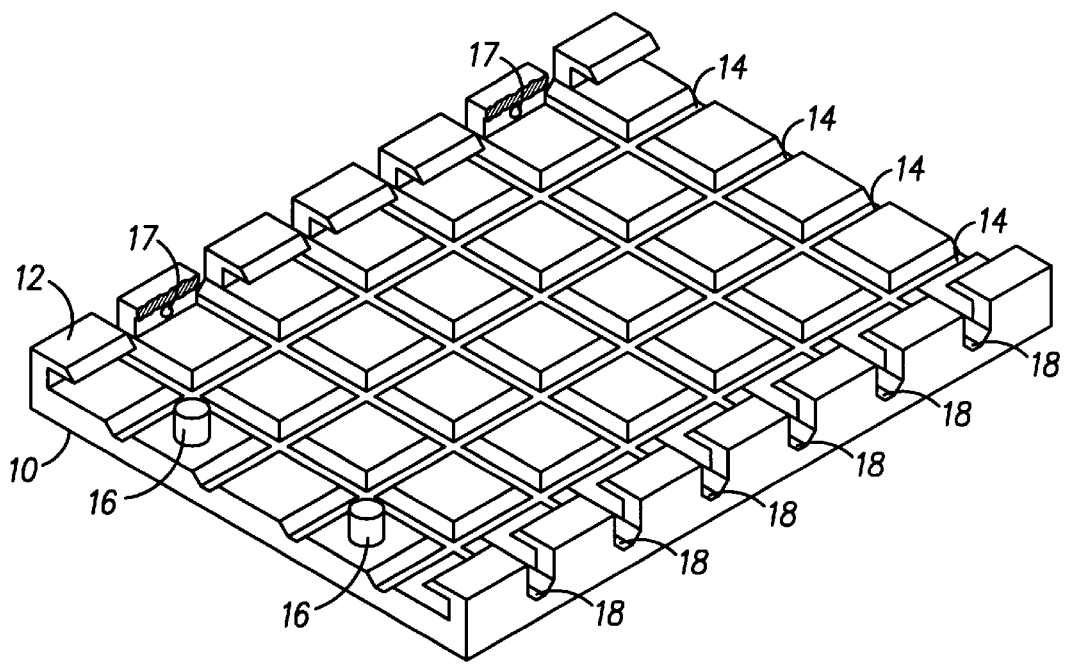
FIG. 2 is an isometric view of the holding fixture of FIG. 1.

FIG. 2 is an isometric view of holding fixture 10 more clearly showing grooves 14 along with cross grooves 18. Grooves 14 and 18 can be spaced to accommodate different sizes of semiconductor devices that might be mounted on the PCB. An area of bent over portion 12 is cutaway to better show bearings 17.

Figure 3:
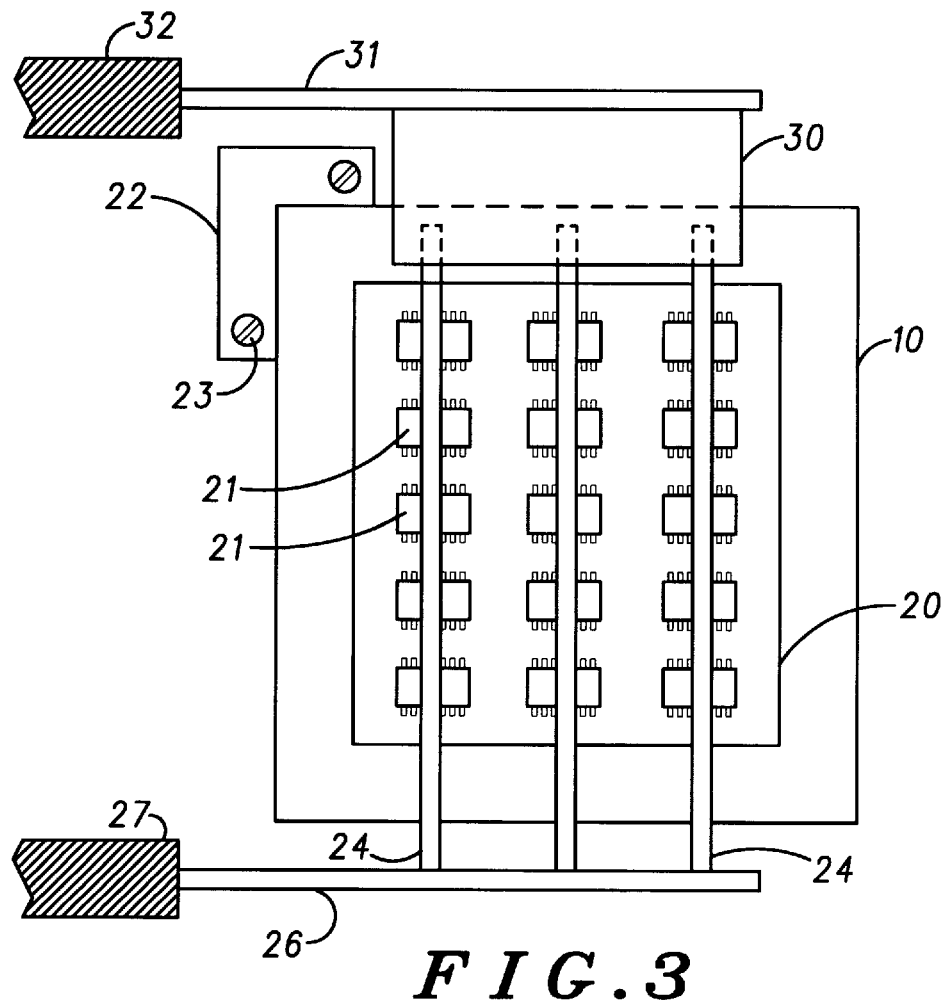
FIG. 3 is a top view of the holding fixture of FIG. 1 being held in place for sawing.

FIG. 3 illustrates holding fixture 10 having one of its corners held in place by a right angle stop 22. Right angle stop 22 is held in place by two bolts or screws 23. In actual implementation another right angle stop can be pneumatically or hydraulically engaged to the opposite corner of holding fixture 10. In other words the another right angle stop can be brought against the opposite corner to press holding fixture 10 against right angle stop 22. This will securely restrain holding fixture 10 during the sawing operation. After the sawing operation the another right angle stop can be retracted to easily remove holding fixture 10. Holding fixture 10 is shown having a substrate or PCB 20 inserted in slots 13 (see FIG. 1). A plurality of semiconductor devices 21 are shown mounted on substrate 20 and arranged in rows and columns. Integrated circuits or semiconductor devices 21 are shown after singulation for a better understanding of the present invention. However, prior to singulation, semiconductor devices 21 are joined together by an epoxy encapsulating material. Thus integrated circuits in chip form are first mounted or installed on a PCB and then encapsulated to form PCB 20. A ring or border is formed around the semiconductor devices, and this ring or border is the portion of PCB 20 that is inserted into slots 13 of FIG. 1. PCB 20 is then placed in the sawing area such as illustrated in FIG. 3. PCB 20 is then sawed in one direction and rotated ninety (90) degrees. Bars 24 are then placed across semiconductor devices 21 in a direction perpendicular to the direction of the first saw cut. A bar 24 is placed across each row of semiconductor devices 21. Sawing is then done parallel to bars 24 in order to singulate semiconductor devices 21.

Bars 24 are attached to a rotating shaft 24 which is rotated by a motor or mechanism 27. Once bars 24 are placed across semiconductor devices 21, the ends opposite to shaft 26 can be held down by a clamp 30. Clamp 30 is attached to a rotating shaft 31. Shaft 31 is rotated to hold down bars 24 by a motor or mechanism 32. If bars 24 are short and of a strong material clamp 30 may not be needed since the only purpose of clamp 30 is to press down the ends of bars 24. Bars 24 are used to insure that semiconductor devices 21 stay in place during and after the last sawing operation. After semiconductor devices 21 are singulated clamp 30 is rotated upwards and away from holding fixture 10. Then bars 24 are rotated away from holding fixture 10. Semiconductor devices 21 are removed from holding fixture 10 by a pick and place machine (not shown).

Figure 4:
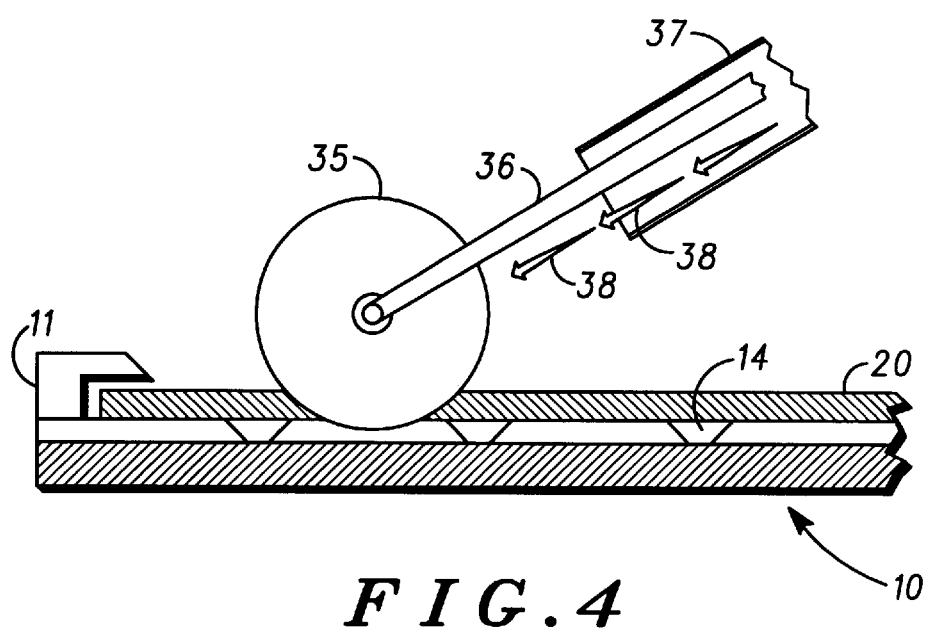
FIG. 4 is a cross sectional view of a portion of a PCB being sawed in accordance with the present invention.

FIG. 4 is a cross sectional view showing a portion of holding fixture 10 with PCB 20 positioned in holding fixture 10. A circular saw blade 35 is driven by drive shaft 36. Drive shaft 36 is surrounded by a shroud 37 which carries de-ionized water which is illustrated by arrows 38. The deionized water can have $CO_2$ bubbled with it in order reduce resistivity of the de-ionized water thereby reducing static electricity that might be generated by saw blade 35.

Saw blade 35 is shown making a first cut in one direction through PCB 20. Note that the cross section through holding fixture 10 is along one of the grooves 18 (see FIG. 2) and saw blade 35 is shown extending into the groove.

By now it should be appreciated that the present invention provides a novel apparatus and approach to singulating a plurality of semiconductor devices that are mounted on a PCB and then encapsulated. This invention eliminates the need to use an adhesive tape on the bottom or contact side of the PCB thereby saving the expense of the tape and the task of removing the pieces of tape and then cleaning the adhesive from the bottom of the PCB.

What is claimed is:

1. A method for singulating a plurality of integrally joined semiconductor devices that are on a substrate, comprising the steps of:

placing the substrate having the plurality of integrally joined semiconductor devices arranged in rows and columns into a holding fixture having slots at corners of the holding fixture;

sliding the substrate into the slots of the holding fixture;

holding one of the corners of the holding fixture in place with a right angle stop;

sawing through the substrate in a first direction;

rotating the holding fixture ninety degrees;

placing a bar across each of the rows of the plurality of integrally joined semiconductor devices in a direction perpendicular to the first direction;

sawing through the substrate in a direction equal to the direction of the bar in order to provide singulated semiconductor devices; and removing the singulated semiconductor devices from the holding fixture with a pick and place machine.

2. The method of claim 1 further including holding down both ends of the bar.

3. The method of claim 1 further including using water during the sawing step.

4. The method of claim 1 further including encapsulating the plurality of integrally joined semiconductor devices prior to placing the substrate in the holding fixture.

* * * * *